United States Patent
Brand et al.

[11] Patent Number: 5,853,959
[45] Date of Patent: Dec. 29, 1998

[54] METHOD OF FABRICATING A CONTOURED SLIDER SURFACE FEATURE WITH A SINGLE MASK

[75] Inventors: John L. Brand, Burnsville; Daniel P. Burbank, Minneapolis, both of Minn.

[73] Assignee: Seagate Technology, Inc., Scotts Valley, Calif.

[21] Appl. No.: 695,374

[22] Filed: Aug. 9, 1996

[51] Int. Cl.⁶ .................................................. G03C 5/00
[52] U.S. Cl. .................. 430/320; 430/396; 216/22; 216/41; 216/58; 29/630.2; 29/630.18; 29/630.15; 29/630.12
[58] Field of Search .................. 430/320, 396, 430/929; 29/603.2, 603.18, 603.15, 603.12; 216/22, 41, 58

[56] References Cited

U.S. PATENT DOCUMENTS

| | | | |
|---|---|---|---|
| 4,564,585 | 1/1986 | Blaske et al. | 430/313 |
| 5,079,657 | 1/1992 | Aronoff et al. | 360/103 |
| 5,126,232 | 6/1992 | Gau | 430/320 |
| 5,137,750 | 8/1992 | Amin et al. | 427/116 |
| 5,162,073 | 11/1992 | Aronoff et al. | 156/625 |
| 5,509,554 | 4/1996 | Samuelson et al. | 215/22 |
| 5,626,941 | 5/1997 | Ouano | 428/141 |

*Primary Examiner*—M. Nuzzolillo
*Assistant Examiner*—Steven H. VerSteeg
*Attorney, Agent, or Firm*—Westman, Champlin & Kelly, P.A.

[57] ABSTRACT

A method of fabricating a contoured surface feature to multiple depths on a surface of a hydrodynamic bearing slider with a single mask includes applying a lithographic resist layer to the slider surface and forming the single mask with a mask pattern which includes a masked area, an unmasked area and an intermediate area between the masked area and the unmasked area. The lithographic resist layer is then exposed through the single mask and removed as a function of exposure to form a patterned resist layer and to thereby uncover portions of the slider surface within the patterned resist layer. The uncovered portions of the slider surface and the patterned resist layer are etched, with the uncovered portions being etched to a first depth below the slider surface. The multiple depth surface feature is created by providing the intermediate mask area with a geometry of masked and unmasked features that is unresolvable by one of the steps of exposing an etching such that an area of the slider surface corresponding to the intermediate mask area is etched to a second depth which is less than the first depth.

26 Claims, 7 Drawing Sheets

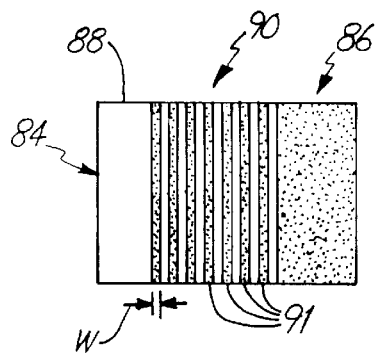 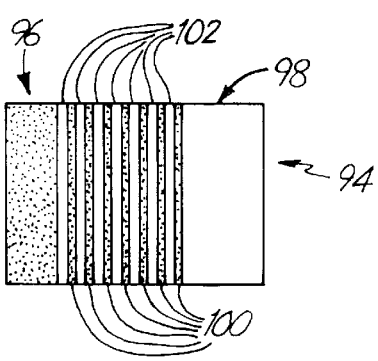
Fig 5A  Fig. 5B
Fig. 6A  Fig. 6B  Fig. 6C
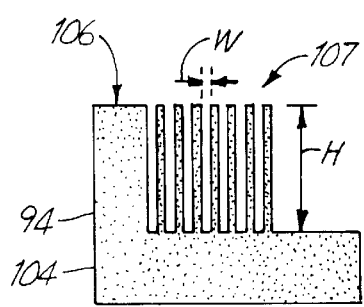 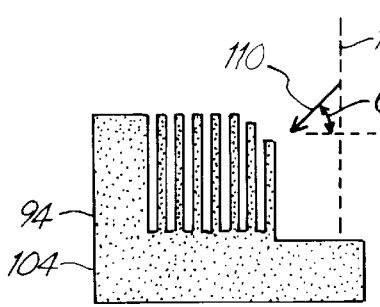 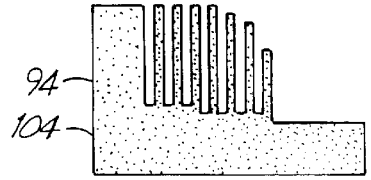
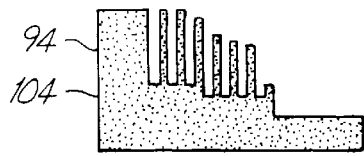 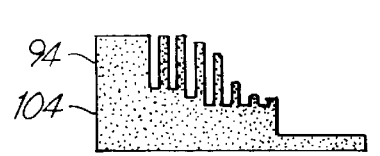 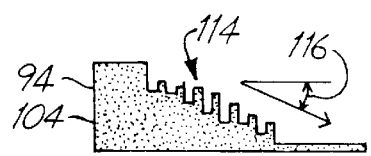
Fig. 6D  Fig. 6E  Fig. 6F

METHOD OF FABRICATING A CONTOURED SLIDER SURFACE FEATURE WITH A SINGLE MASK

BACKGROUND OF THE INVENTION

The present invention relates to disc drive data storage systems and, more particularly, to a method of fabricating a multiple depth surface feature on a hydrodynamic bearing slider with a single mask.

Disc drives of the "Winchester type" are well known in the industry. Such drives use rigid discs coated with a magnetizable medium for storage of digital information in a plurality of circular, concentric, data tracks. The discs are mounted on a spindle motor which causes the discs to spin and the surfaces of the discs to pass under respective head gimbal assemblies (HGAs). The HGAs carry transducers which write information to and read information from the disc surface. An actuator mechanism moves the HGAs from track to track across the surface of the discs under control of electronic circuitry. The actuator mechanism includes a track accessing arm and a load beam for each HGA. The load beam provides a preload force which presses the HGA toward the disc surface.

The HGA includes a hydrodynamic (e.g. air) bearing slider and a gimbal. The gimbal is positioned between the slider and the load beam to provide a resilient connection that allows the slider to pitch and roll while following the topography of the disc. The slider includes a slider body having an air bearing surface which faces the disc surface. As the disc rotates, the disc drags air under the slider along the air bearing surface in a direction approximately parallel to the tangential velocity of the disc. Skin friction on the air bearing surface causes the air pressure between the disc and the air bearing surface to increase which creates a hydrodynamic lifting force that causes the slider to lift and fly above the disc surface. The preload force supplied by the load beam counteracts the hydrodynamic lifting force. The preload force and the hydrodynamic lifting force reach an equilibrium based upon the hydrodynamic properties of the slider and the speed of rotation of the disc. The transducer is typically mounted at or near the trailing edge of the slider.

A conventional catamaran slider includes a pair of raised side rails which face the disc surface and form the air bearing surfaces. The raised side rails and other surface features on the slider are typically formed through a photolithography process followed by an ion milling or reactive ion etching process. Traditional photolithography processes use masks with hard edges to create well-defined patterns in the slider surface. Angled ion milling is often used to decrease redeposition of the milled substrate. Angled ion milling does decrease somewhat the slope of the edge feature in the slider surface. With angled ion milling, an ion beam is directed to the slider surface at an angle with respect to the slider surface. The ion beam is then rotated about an axis perpendicular to the slider surface. Angled ion milling results in well defined sidewalls with relatively large slopes. These edges tend to accumulate lubricant and debris during disc drive operation.

Photolithography techniques have also been used to recess portions of the pole tips of the read/write transducers at the trailing edge of the slider to improve performance, such as undershoot performance. The edges of the recesses can also serve as debris and lubricant collection areas.

There is a continuing need for improved fabrication processes of slider surface features which improve performance of the slider or read/write head while minimizing collection of debris and lubrication.

SUMMARY OF THE INVENTION

The fabrication process of the present invention forms a multiple depth surface feature on a surface of a hydrodynamic bearing slider with a single mask. The method includes applying a lithographic resist layer to the slider surface and forming the single mask with a mask pattern which includes a masked area, an unmasked area and an intermediate area between the masked area and the unmasked area. The lithographic resist layer can include a positive resist or a negative resist material. The lithographic resist layer is then exposed through the single mask and removed as a function of exposure to form a patterned resist layer and to thereby uncover portions of the slider surface within the patterned resist layer. The uncovered portions of the slider surface and the patterned resist layer are etched, with the uncovered portions being etched to a first depth below the slider surface. The intermediate mask area has a geometry that is unresolvable by one of the steps of exposing and etching such that an area of the slider surface corresponding to the intermediate mask area is etched to a second depth which is less than the first depth.

BRIEF DESCRIPTION OF THE DRAWINGS

FIG. 5A is a plan view of an aspect ratio limited photolithography mask, in accordance with the present invention.

FIG. 5B is a plan view of an exposed photoresist pattern resulting from the mask shown in FIG. 5A.

FIGS. 6A–6F are cross-sections of a photoresist pattern and a slider substrate during progression through an ion milling process.

DETAILED DESCRIPTION OF THE PREFERRED EMBODIMENTS

Figure 1:
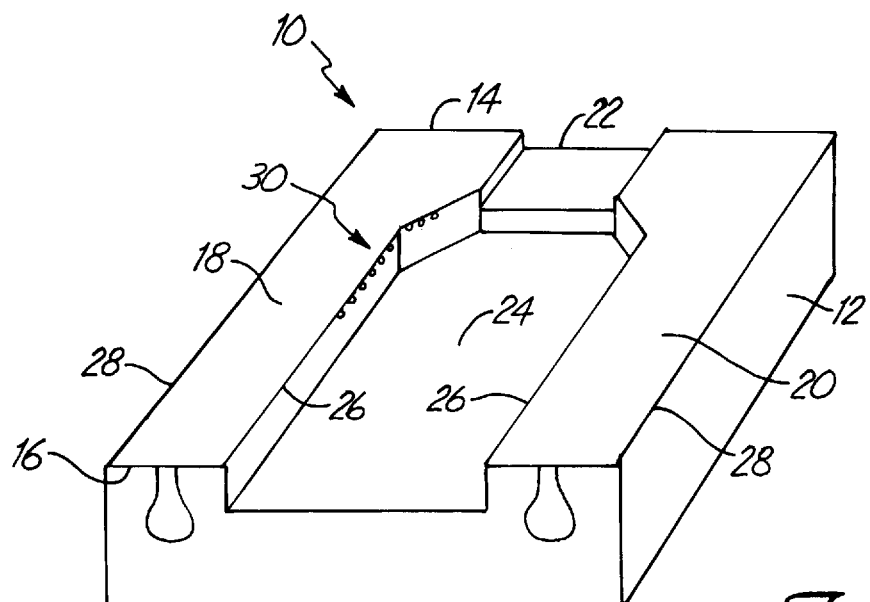
FIG. 1 is a perspective view of a hydrodynamic bearing slider, as viewed from its trailing edge and air bearing surface.

FIG. 1 is a perspective view of a hydrodynamic bearing slider, as viewed from a trailing edge. Slider 10 includes a substrate 12 (e.g. ceramic), a leading edge 14, a trailing edge 16, raised side rails 18 and 20, cross rail 22 and subambient pressure cavity 24. Raised side rails 18 and 20 form air bearing surfaces with inside and outside edges 26 and 28. A typical fabrication process forms rails 18 and 20 with hard, well-defined edges. It has been found that these edges tend to accumulate lubricant and debris 30 during operation. Different air bearing shapes have different lubricant and debris accumulation properties.

Collection of lubricant and debris can be limited by forming the edges of side rails 18 and 20 with relatively smooth, shallow slopes. These shallow slopes can be fabricated according to the present invention with a single lithographic mask and etching process by providing the mask with additional features that are unresolvable by the imaging apparatus or the etching apparatus.

1. Resolution Limited Photolithography

Figure 2A:
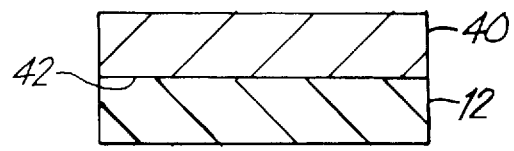
FIGS. 2A–2F are cross-sections of a slider substrate, which illustrate the processing steps performed on the substrate according to one embodiment of the present invention.

FIGS. 2A–2F are cross-sections of slider substrate 12 in schematic form, which illustrate the processing steps performed on the substrate according to one embodiment of the present invention. The dimensions shown in FIGS. 2A–2F are greatly exaggerated for clarity. In FIG. 2A, a positive photolithography resist ("photoresist") layer 40 is applied to surface 42 of substrate 12. A variety of photoresist materials can be used, such as a diazonapththoquinone sulfonic ester, which is sold under the name NOVOLAK.

Figure 2B:
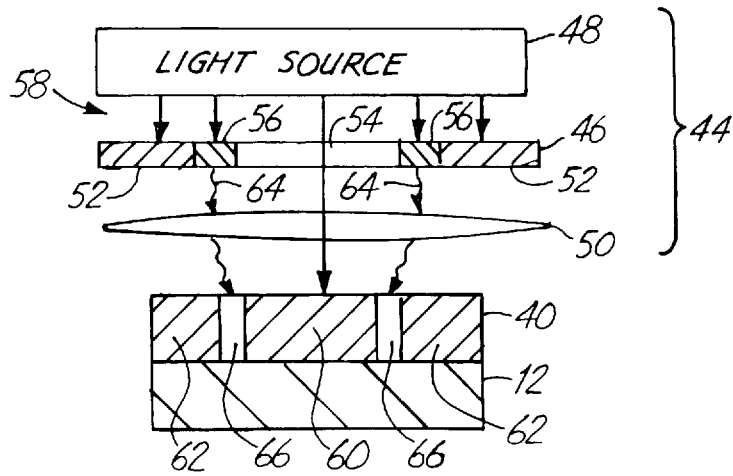

In FIG. 2B, an imaging apparatus 44 exposes photoresist layer 40 through a photolithography mask 46. Imaging apparatus 44 includes a light source 48 and a lens 50, which are well known in the art. Mask 46 has a plurality of masked and unmasked areas which are arranged in a desired pattern for exposing photoresist layer 40. For example, mask 46 includes masked areas 52 and unmasked area 54. Light 58 generated by light source 48 is blocked by masked areas 52 and passes through unmasked area 54. Lens 50 focuses light 58 passing through mask 46 onto photoresist layer 40 and thereby projects the desired pattern onto photoresist layer 40.

Light 58 exposes portion 60 of photoresist layer 40 which correspond to unmasked area 54, while portions 62 remain unexposed. Exposing portions 60 to light 58 induces a chemical change in the positive photoresist material which causes the portions to be susceptible to etching, as is well known in the art. Unexposed portions 62 resist etching.

According to the present invention, mask 46 includes additional, intermediate areas 56 between masked area 52 and unmasked areas 54. Intermediate areas 56 have geometries that are beyond the resolution capability of imaging apparatus 44. The light pattern passing through intermediate areas 56 becomes blurred as represented by wavy lines 64. As a result, the blurred light pattern only partially exposes intermediate portions 66 of photoresist layer 40.

Figure 2C:
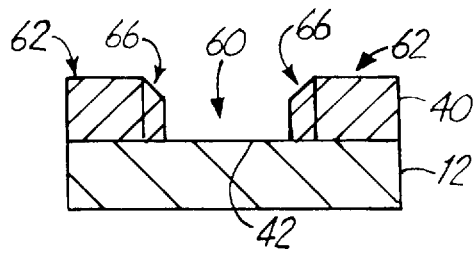

In FIG. 2C, photoresist layer 40 is removed through a chemical dissolution process as a function of the level of exposure to form a patterned photoresist. With the positive resist, fully exposed portion 60 is completely stripped from slider surface 42, unexposed portions 62 remain on surface 42 and partially exposed portions 66 are partially stripped. After milling, the partial stripping of portions 66 provides sloping sidewalls between the stripped and unstripped resist portions.

Figure 2D:
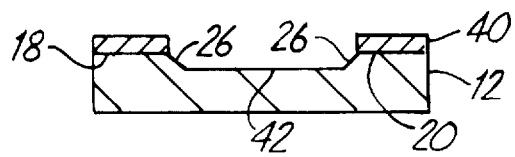

In FIG. 2D, the unstripped portions of the patterned photoresist layer 40 and the uncovered portions of slider surface 42 are etched to form the desired pattern in slider surface 42. This pattern includes side rails 18 and 20. Etching can include various types of etching, such as reactive or nonreactive ion milling for example. The sloping sidewall contour of partially stripped photoresist portions 66 are transferred to slider surface 42 to create smooth, sloped transitions along inside edges 26 of side rails 18 and 20, shown in FIG. 1.

Figure 2E:
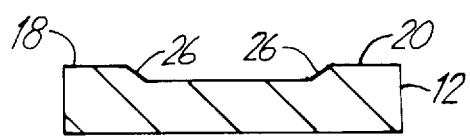
Figure 2F:
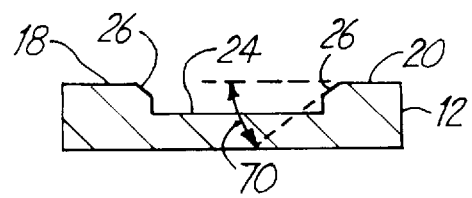

After etching, a small portion of photoresist layer 40 remains on slider surface 42. In FIG. 2E, the remaining portions of photoresist layer 40 are removed, leaving the desired surface pattern in slider substrate 12. Preferably, inside edges 26 have a maximum slope 70 of 20 degrees as measured from a plane defined by the air bearing surfaces of side rails 18 and 20. Most preferably, the slope 70 is a maximum of 15 degrees. Further photolithography steps can then be performed to form additional surface features on slider substrate 12. For example, in FIG. 2F the subambient pressure cavity 24 has been formed between side rails 18 and 20.

Figure 3:
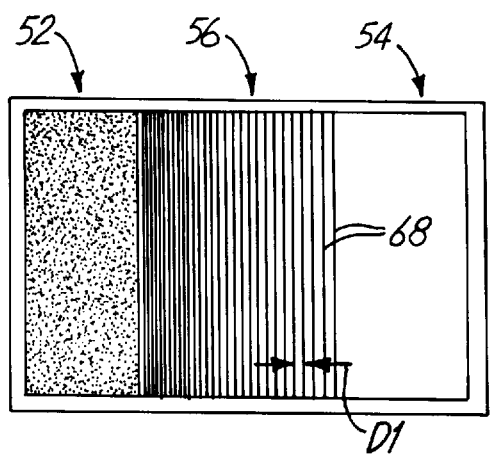
FIG. 3 is a plan view of a portion of a photolithography mask according to the present invention.

FIG. 3 is a plan view of a portion of mask 46 which illustrates one of the intermediate, partially masked areas 56 in greater detail. Intermediate area 56 is positioned between masked area 52 and unmasked area 54. Intermediate area 56 includes a plurality of masked and unmasked features having a geometry that is smaller than the resolution of imaging apparatus 44. The resolution capability of imaging apparatus 44 can be reduced by controlled defocus. Each vertical line 68 within intermediate area 56 represents a masked feature. The gaps between the vertical lines represent unmasked features. The width of each masked feature is smaller than the imaging capabilities of image apparatus 44 such that the masked features are not accurately reproduced on photoresist layer 40.

In the embodiment shown in FIG. 3, lines 68 have equal widths and are separated by distance D1 which progressively increases from masked area 52 toward unmasked area 54. This provides a gradient in the level of light 58 passing through intermediate area 56, which results in a gradient in the level of exposure in partially exposed portions 66 (shown in FIG. 2B) from unexposed portion 62 toward unexposed portion 60. At the left edge of intermediate area 56, the mask lines 68 are spaced close together such that the photoresist layer 40 is mostly unexposed. At the right edge of intermediate area 56, the mask lines 68 are widely spaced such that the photoresist layer 40 is mostly exposed. In an alternative embodiment, the spacing D1 between lines 68 remains equal, but the width of each line progressively decreases from masked area 52 toward unmasked area 54. This also provides a gradient in the level of light passing through intermediate area 56.

In the embodiment shown in FIGS. 2 and 3, the photolithography mask includes additional, unresolvable mask features at the edge of the masked areas. The features are too small for the imaging system to image accurately. These optically, unresolvable features result in a continuous "grey" area at the edge of the masked areas. By varying the spacing, width and shape of the features, the extent of the "grey" area can be controlled. The unresolvable mask features can include shapes other than the lines shown in FIG. 3. These shapes can include circles, dots, ovals, cross-hatches, diamonds, saw-teeth, scallops or other shapes. The shapes can form either the intermediate masked features or the intermediate unmasked features. The shapes can be arranged in any desired pattern with fixed or varying density.

Figure 4A:
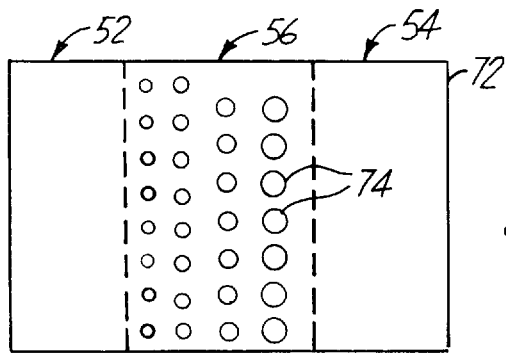
FIGS. 4A–4C are plan views of masks having various shaped masked features, in accordance with the present invention.
Figure 4B:
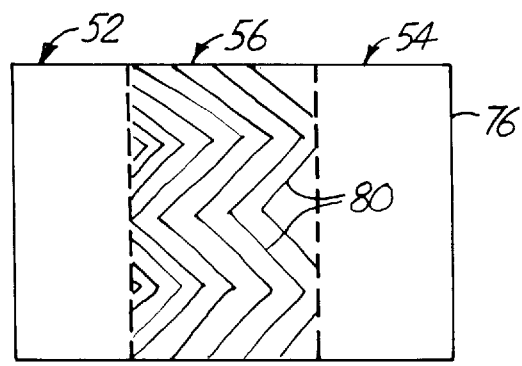
Figure 4C:
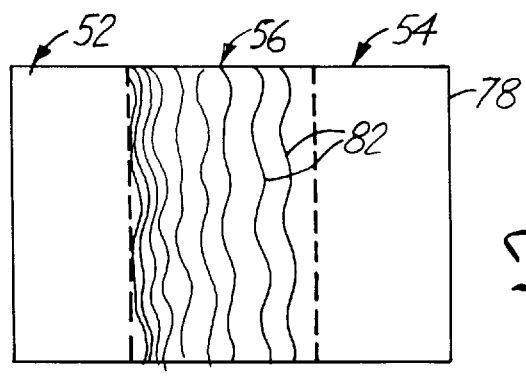

FIG. 4A is a plan view of a mask 72 having a plurality of circular shaped apertures 74 within intermediate area 56. Apertures 74 increase in diameter from masked area 52 toward unmasked area 54 to provide increasing exposure from masked area 52 toward unmasked area 54. Alternatively, apertures 74 can be sized equally and increase in density toward unmasked area 54. FIGS. 4B and 4C are plan views of masks 76 and 78 which have saw-tooth and scallop shaped masked features 80 and 82 within intermediate area 56, respectively. These features decrease in density, from masked area 52 toward unmasked area 54. Various other shapes and patterns can also be used in accordance with the present invention.

In an alternative embodiment, the photolithography mask is physically applied to the surface of the slider on top of, and in controlled proximity to, the layer of photoresist. In this embodiment, the proximity of the mask is decreased such that, due to the solid angle subtended by the light projected toward the mask, the fine feature resolution of the proximity exposure is inhibited by penumbral shadowing. The mask pattern cannot be accurately reproduced on the photoresist. The thickness of the mask causes the mask to be beyond the optical resolution of the imaging apparatus.

2. Aspect Ratio Limited Photolithography

The sloped edges can also be formed in the slider surface by adding features to the photolithography mask that are unresolvable by the etching process (e.g. ion milling), as opposed to the imaging process. While these features can be reproduced accurately onto the photoresist, the resulting etched pattern is altered by limitations of the etch process to transfer small features into the etched surface. As a result, the slider surface is formed with smooth or contoured, sloped transitions between milled and unmilled areas. The unresolvable mask features are defined such that the resulting pattern in the photoresist has a high aspect ratio in that the height of the photoresist is large compared to either the spacing between the photoresist features or the width of the photoresist features.

FIG. 5A is a plan view of an aspect ratio limited photolithography mask 84 having additional masked features that are altered during transfer into the ion milled surface by process resolution limitations. Mask 84 includes a masked area 86, an unmasked area 88 and an intermediate area 90. Intermediate area 90 has a plurality of intermediate masked features 91 which are optically resolvable and can be accurately reproduced on the photoresist. However, the intermediate masked features 91 have a width (W) which is small compared to the height of the photoresist.

FIG. 5B is a top plan view of an exposed photoresist pattern 94 resulting from the aspect ratio limited mask 84 shown in FIG. 5A. The photoresist material includes a negative photoresist. In an alternative embodiment, a positive photoresist is used. Photoresist pattern 94 includes a fully exposed portion 96 corresponding to unmasked area 88, an unexposed resist portion 98 corresponding to masked area 86 on mask 46 and a plurality of intermediate exposed and unexposed portions 100 and 102, respectively, corresponding to intermediate area 90 of mask 84.

FIGS. 6A–6F are cross sections of the photoresist pattern 94 and slider substrate 104 during progression through the ion milling process. Following stripping, photoresist pattern 94 has a plurality of spaced resist features 106 and 107, which correspond to exposed portions 96 and 100, respectively, shown in FIG. 5B. Resist features 106 and 107 have a height (H) on slider substrate 104 and are separated by gaps having the width (W).

Ion milling begins in FIG. 6B. Ion beam 110 is directed toward photoresist pattern 94 and the uncovered surface of slider substrate 104 at an angle θ which is measured from a vector within a plane parallel to the surface of slider substrate 104. In one embodiment, ion beam 110 is rotated about an axis 112 which is perpendicular to the surface of slider substrate 104. As discussed above, the intermediate photoresist features have a high aspect ratio (H/W). In a preferred embodiment, the aspect ratio (H/W) is defined as H/W≧tan θ. As seen by the progression through FIGS. 6B–6F, the intermediate resist features 107 initially "shadow" one another from right to left. As the ion milling progresses, the resist on the right of the figures becomes milled and no longer shadows the adjacent features. The resist features on the right are milled at a faster rate than the resist features on the left, which creates a sloped edge 114 in the surface of slider substrate 104. Edge 114 has a slope 116 which is preferably a maximum of 20 degrees and, most preferably, a maximum of 15 degrees as measured from the slider surface. Although the process shown in FIGS. 6A–6F are discussed with reference to ion milling, other directed beam anisotropic etching processes can also be used to achieve the shadowing effect caused by the high aspect ratio photoresist features. Although FIGS. 6A–6F show the milling process creating sharp features in the slider surface, the topography of the features are much more rounded.

Figure 7:
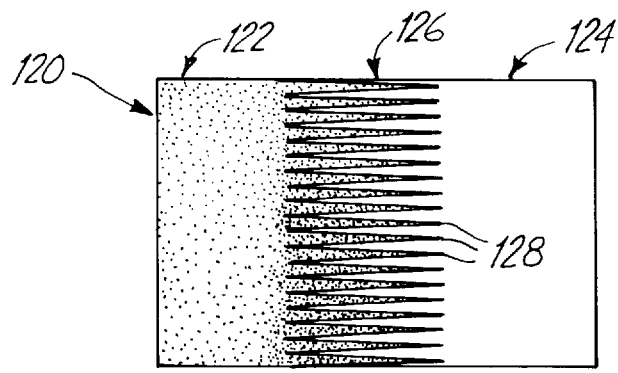
FIG. 7 is a plan view of a mask having saw-tooth shaped masked features.

The intermediate resist features can have a variety of shapes in addition to the rectangles shown in FIGS. 5 and 6. For example, the intermediate resist features can include circles, dots, ovals, cross hatches, diamonds, saw-teeth, scallops and other shapes. FIG. 7 illustrates a mask 120 which creates intermediate resist features having a saw-tooth shape. Mask 120 includes a masked area 122, an unmasked area 124 and an intermediate area 126. Intermediate area 124 has a plurality of saw-tooth shaped intermediate mask features 128. As in the embodiment shown in FIGS. 5 and 6, intermediate masked features 128 create patterns in the photoresist which shadow one another during the initial stages of the ion milling process.

3. Example

Figure 8A:
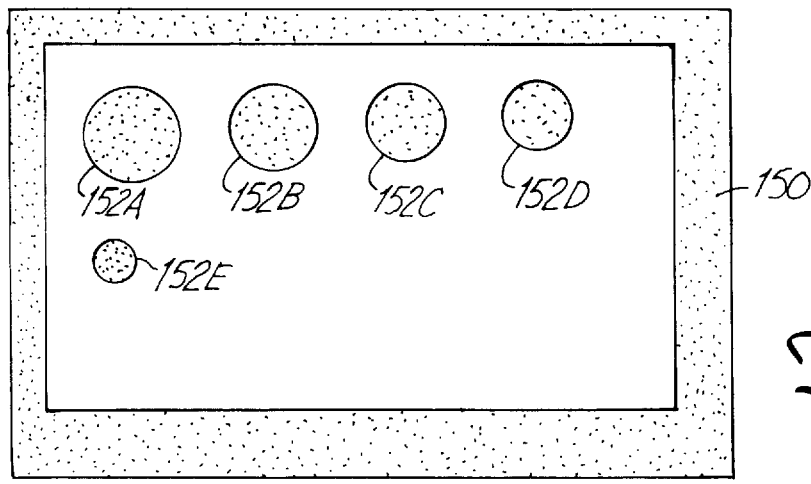
FIGS. 8A is plan view of a mask having a plurality of differently sized circular masked areas.
Figure 8B:
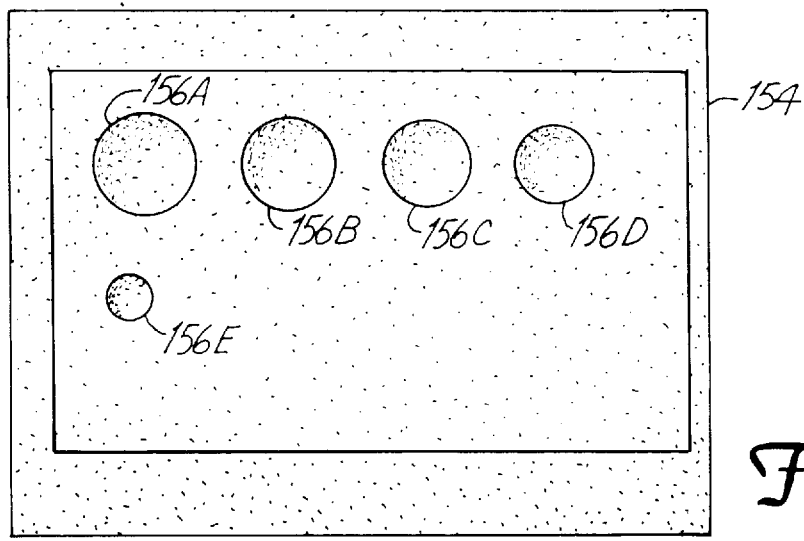
FIG. 8B is a photograph of a slider substrate material having a plurality of milled holes resulting from the mask shown in FIG. 8A.

FIG. 8A is a schematic of a mask 150 having a plurality of differently sized circular masked areas 152A–152E. FIG. 8B is a photograph of a slider substrate material 154 having a plurality of milled holes 156A–156E resulting from the mask shown in FIG. 8A. The largest hole 156A is 60 micrometers in diameter. The smallest hole 156E is 22 micrometers in diameter. The photoresist used during the milling process was about 30 micrometers high. Consequently, the aspect ratio (height of photoresist to width of hole) of the largest resist feature was 0.5 and the aspect ratio of the smallest resist feature was 1.35. The ion milling angle θ was 45 degrees (tan(θ)=1.0).

Figure 8C:
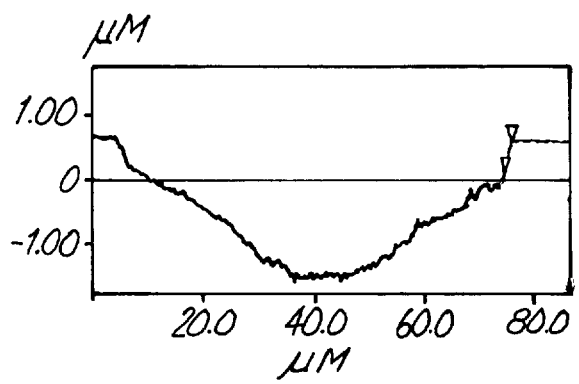
FIGS. 8C and 8D are graphs illustrating profiles of two of the holes shown in FIG. 8B.

FIG. 8C is a plot of the cross section of the largest hole 156A. The edge of hole 156A has a slope of 18–21 degrees as measured from the surface adjacent the hole. The center of hole 156A has a slope of about 3 degrees.

Figure 8D:
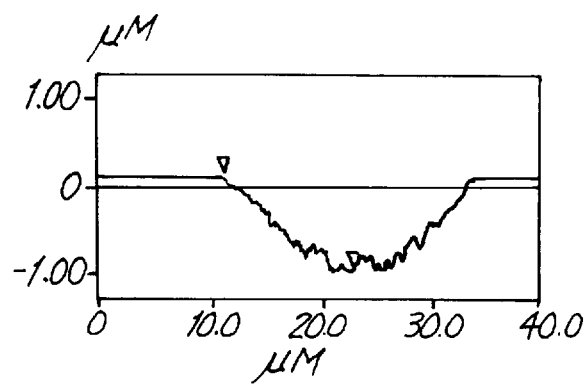

FIG. 8D is a plot of a cross section of the smallest hole 156E. The edge of hole 156E has a constant slope of about 5 degrees. The slope of hole 156E is much less than the slope of hole 156A because of the higher aspect ratio. In other words, the height of the photoresist surrounding hole 156E was sufficiently large as compared to the diameter of the hole that the photoresist shadowed the hole during the angled ion milling process. Initially, the ions were unable to reach the substrate surface until the edge of the photoresist was milled to less than the width of the hole.

The resolution limited and aspect ratio limited photolithography fabrication processes of the present invention permits a transition from non-milled to milled areas on the slider surface to extend over a controlled width. By shaping the edges of the slider surface in a controlled manner, debris and lubricant accumulation can be minimized during disc drive operation. Also, the fabrication processes of the present invention allow the slider surface to be milled at multiple depths with a single mask pattern and photoresist. This can be used to form the edges of air bearing surfaces or edges of other features on the slider surface. For example, the fabrication processes can be used to perform multiple-depth patterning of pole tips in the read/write head to improve performance of the head while limiting debris and lubricant collection. Pole tips have been contoured to provide undershoot reduction. Current processes only permit single level pole patterning depths. With the present invention, pole patterning features can be created with complex contours to optimize the edges of the poles for reduced debris and lubricant accumulation.

4. Use of Aspect Ratio Limited Photolithography for Creating Raised or Recessed Air Bearing Features In another aspect of the present invention, the aspect ratio limited photolithography process can be used to created raised or recessed air bearing surface features. According to the present invention, photolithographic techniques are used to create photoresist patterns with high aspect ratios that cannot be reproduced during the ion milling process. Consequently, the resulting surface features on the slider have curved edges and contoured topographies. The contoured typographies create reduce debris collection and provide strength to the protruding surfaces.

Figure 9A:
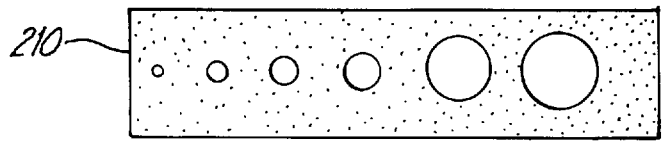
FIGS. 9A–9C illustrate a process for fabricating raised air bearing surface features according to the present invention.
Figure 9B:
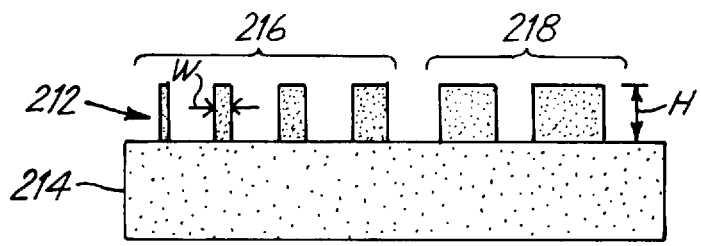
Figure 9C:
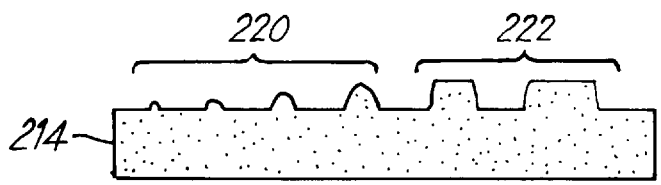

FIGS. 9A–9C illustrate a process for fabricating raised air bearing surface features according to the present invention. FIG. 9A is a plan view of a mask 210 having a plurality of circular, unmasked apertures of various diameters. FIG. 9B is a cross section of a patterned photoresist layer 212 on the surface of a slider substrate 214, which results from the mask shown in FIG. 9A. FIG. 9C is a cross section of slider substrate 214 after milling.

Patterned photoresist layer 212 includes a plurality of resist features 216 and 218 having a height (H) and a width (W). The aspect ratio of each feature is defined as H/W. Resist features 216 have high aspect ratios (greater than 1.5) and are thus not completely resolvable during the ion milling process. Since the aspect ratios of resist features 216 are high, the resist features are milled from the top and sides which causes surface features 220 formed in substrate 214 to become rounded.

Resist features 218 have conventional, lower aspect ratios (less than 1.0). Resist features 218 remain on the surface of substrate 214 during the entire milling process, which prevents any substrate removal. The corresponding surface features 224 formed in substrate 214 therefore have sharp sidewalls.

Figure 10A:
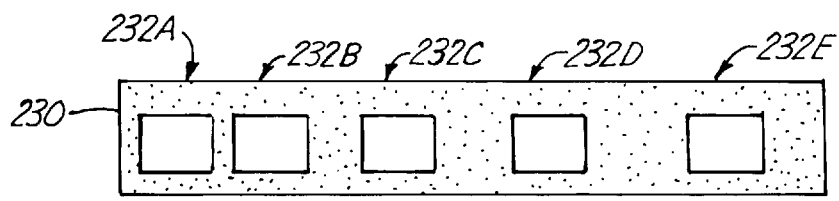
FIGS. 10A–10C illustrate a process for fabricating recessed air bearing surface features according to the present invention.
Figure 10B:
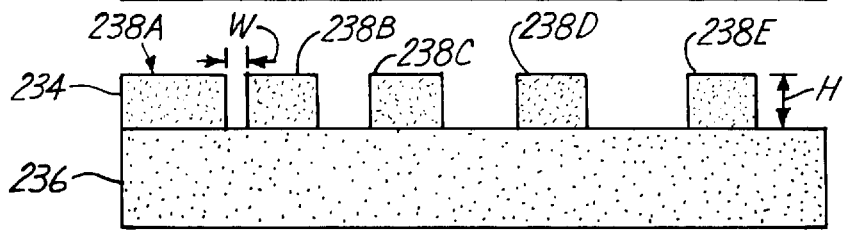
Figure 10C:
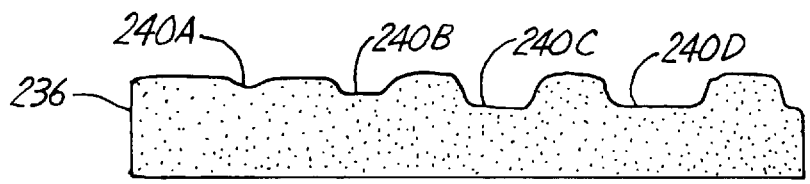

FIGS. 10A–10C illustrate a fabrication process for fabricating recessed features, as opposed to raised features on the air bearing surface. FIG. 10A is a plan view of a mask 230 having a plurality of unmasked apertures 232A–232E. Apertures 232A and 232B are spaced closely together which causes the resulting photoresist features to shadow one another during the milling process and therefore create surface features in the slider surface with rounded slopes. In contrast, apertures 232B–232E are spaced further apart.

FIG. 10B is a cross section of a patterned photoresist layer 234 on the surface of a slider substrate 236, which results from the mask shown in FIG. 10A. Patterned photoresist layer 234 includes resist features 238A–238E corresponding to apertures 232A–232E. Resist features 238A–238E have a height (H) and are separated by a gap having a width (W).

FIG. 10C is a cross section of substrate 236 after milling. Recessed features 240A–240D are formed in substrate 236 at the gaps between resist features 238A–238E. Since the gap between resist features 238A and 238B is small compared to the height H, recessed feature 240A has shallow, sloping sidewalls. Since the gap between resist features 238B and 238E is larger, recessed features 240B–240D have relatively sharply defined, steep sidewalls. There is little or no shadowing between resist features 238B–238E.

Although the present invention has been described with reference to preferred embodiments, workers skilled in the art will recognize that changes may be made in form and detail without departing from the spirit and scope of the invention. For example, the present invention has been described with respect to a photolithography process. However, the present invention is equally applicable to other lithography processes such as electron beam and x-ray lithography.

What is claimed is:

1. A method of fabricating a multiple depth feature on a surface of a hydrodynamic bearing slider, the method comprising:

applying a lithographic resist layer to the slider surface;

forming a single mask having a mask pattern which includes a masked area, an unmasked area and an intermediate area between the masked area and the unmasked area;

exposing the lithographic resist layer through a single mask;

removing the lithographic resist layer as a function of exposure to form a patterned resist layer and to thereby uncover portions of the slider surface within the patterned resist layer;

etching the uncovered portions of the slider surface and the patterned resist layer, with the uncovered portions being etched to a first depth below the slider surface; and wherein the step of forming the single mask includes providing the intermediate area with a geometry that is unresolvable by one of the steps of exposing and etching such that an area of the slider surface corresponding to the intermediate mask area is etched to a second depth below the slider surface which is less than the first depth.

2. The method of claim 1 wherein:

the step of forming the single mask comprises defining the geometry of the intermediate mask area with a linear dimension; and the step of exposing comprises projecting the single mask onto the resist layer with an imaging apparatus having a resolution that is larger than the linear dimension such that a first portion of the lithographic resist layer corresponding to the unmasked area is exposed at a first exposure level, a second portion of the lithographic resist layer corresponding to the masked area is unexposed and a third portion of the lithographic resist layer corresponding to the intermediate area is partially exposed at a second exposure level which is lower than the first exposure level.

3. The method of claim 1 wherein:

the step of applying comprises applying to the slider surface a lithographic resist layer having a height, H;

the step of forming the single mask comprises defining the geometry of the intermediate mask area such that the step of removing forms the patterned resist layer with first and second resist features on the slider surface which are separated by a gap having a width, W; and the step of etching comprises performing a directed, anisotropic etch at an angle θ which is measured from a vector within a plane of the slider surface, wherein $H/W \geq \tan \theta$.

4. The method of claim 1 wherein:

the step of removing comprises forming the patterned resist layer with a resist feature having a height, H, and a width, W; and the step of etching comprises performing a directed, anisotropic etch at an angle θ which is measured from a vector within a plane of the slider surface, wherein $H/W \geq \tan \theta$.

5. The method of claim 1 and further comprising:

physically applying the single mask to the lithographic resist layer, the mask having a height, H;

the step of forming the intermediate mask area comprises forming intermediate masked and unmasked areas, wherein the intermediate masked areas are separated by a gap having a width, W, and selecting the height, H, and the width, W, such that the step of exposing exposes the lithographic resist layer at the intermediate unmasked areas less than the unmasked area of the mask pattern and more than the masked area of the mask pattern.

6. The method of claim 1 and further comprising forming the intermediate mask area with a shape selected from the group consisting of circle, oval, cross-hatch, diamond, sawtooth and scallop.

7. The method of claim 1 wherein the step of etching comprises etching the area of the slider surface corresponding to the intermediate mask area such that the slider surface has a vertical slope which is a maximum of fifteen degrees measured from a plane defined by the slider surface.

8. A method of fabricating a hydrodynamic bearing slider to form a vertically contoured feature on a surface of the slider with a single mask, the method comprising:

applying a lithographic resist layer to the slider surface;

exposing the resist layer through the single mask such that a first portion of the resist layer is exposed at a first exposure level, a second portion of the resist layer is unexposed and a third portion of the resist layer, which is positioned between the first and second portions, is partially exposed at a second exposure level which is lower than the first exposure level;

removing the resist Layer as a function of exposure to uncover a portion of the slider surface, wherein the third portion of the resist layer is only partially stripped; and etching the resist layer and the uncovered portion of the slider surface.

9. The method of claim 8 and further comprising:

forming the mask with a fully masked portion,
a fully unmasked portion and an intermediate portion between the fully masked portion and the fully unmasked portion, wherein the intermediate portion has a geometry of intermediate masked and unmasked areas which has a linear dimension; and the step of exposing comprises exposing the resist layer through the single mask with an imaging apparatus having a resolution that is larger than the linear dimension so that the intermediate portion is resolved inaccurately by the imaging apparatus.

10. The method of claim 9 wherein the step of forming the mask comprises:

forming the intermediate masked and unmasked areas so that a distance between intermediate masked areas is smaller than the resolution of the imaging apparatus.

11. The method of claim 10 wherein forming the intermediate masked and unmasked areas comprises progressively increasing the distance between the intermediate masked areas from the fully masked portion toward the fully unmasked portion to increase exposure of the resist layer progressively from the fully masked portion toward the fully unmasked portion.

12. The method of claim 9 wherein the step of forming the mask comprises:

forming the intermediate masked and unmasked areas so that the intermediate masked areas have a width that is smaller than the resolution of the imaging apparatus.

13. The method of claim 12 wherein forming the intermediate masked and unmasked areas comprises progressively decreasing the width of the intermediate masked areas from the fully masked portion toward the fully unmasked portion to increase exposure of the resist layer progressively from the fully masked portion toward the fully unmasked portion.

14. The method of claim 9 wherein the step of forming the mask comprises varying the shape of the intermediate masked areas from the fully masked portion toward the fully unmasked portion to increase exposure of the resist layer progressively from the fully masked portion toward the fully unmasked portion.

15. A method of fabricating a multiple depth feature on a surface of a disc head slider with a single lithographic resist, the method comprising:

forming first and second lithographic resist features on the slider surface which are separated by a gap, the resist features covering a first portion of the slider surface and leaving a second portion of the slider surface uncovered within the gap, wherein the resist features have a height, H, and the gap has a width, W; and performing a directed beam anisotropic etch on the resist features and the second, uncovered portion of the slider surface at an angle θ, which is measured from a vector within a plane defined by the slider surface, wherein $H/W \geq \tan \theta$.

16. The method of claim 15 wherein the multiple depth feature comprises a raised surface, a recessed surface and an edge between the raised and recessed surfaces and wherein the step of forming the first and second lithographic resist features comprises:

forming a plurality of longitudinal resist features generally parallel to the edge and separating the plurality of resist features from one another gaps having the width, W.

17. The method of claim 15 wherein the multiple depth feature to be fabricated comprises a raised surface, a recessed surface and an edge between the raised and recessed surfaces and wherein the step of forming the first and second lithographic resist features comprises:

forming a patterned lithographic resist layer on the slider surface which covers the surface to be raised and uncovers the surface to be recessed: and forming a sawtooth pattern in the lithographic resist layer along the edge, wherein individual teeth within the sawtooth pattern define the first and second resist features and a distance between the individual teeth defines the gap.

18. The method of claim 15 wherein the multiple depth feature to be fabricated comprises a raised surface, a recessed surface and a sloped edge between the raised and recessed surfaces and wherein the step of forming the first and second lithographic resist features comprises:

forming a patterned lithographic resist layer on the slider surface which covers the surface to be raised and uncovers the surface to be recessed: and forming a plurality of apertures in the patterned resist layer along the edge, wherein the apertures have the width, W.

19. The method of claim 15 wherein the multiple depth feature to be fabricated comprises a raised surface, a recessed surface and a sloped edge between the raised and recessed surfaces and wherein the step of forming the first and second lithographic resist features comprises:

forming a patterned lithographic resist layer on the slider surface which covers the surface to be raised, uncovers the surface to be recessed and includes a plurality of resist features which are spaced from each other by the width, W.

20. The method of claim 15 wherein the step of performing a directed, anisotropic etch comprises ion milling.

21. The method of claim 20 wherein the step of ion milling comprises directing an ion beam toward the slider surface at the angle $\theta$ and rotating the ion beam along a circular path.

22. A method of fabricating a surface feature on a bearing surface of a hydrodynamic bearing slider, the method comprising:

forming a lithographic resist pattern on the bearing surface, the pattern having a resist feature corresponding to the surface feature to be fabricated and the resist feature having a dimension; and performing a directed beam anisotropic etch on the lithographic resist pattern and the bearing surface, which is incapable of accurately reproducing the dimension on the bearing surface so that the corresponding surface feature has a rounded contour with sloping side walls.

23. The method of claim 22 wherein:

forming the lithographic resist pattern comprises forming the resist feature with a height, H, and a width, W, wherein $H/W \geq 1.5$; and performing the step of etching comprises etching at an angle $\theta$ measured from a vector in a plane defined by the bearing surface.

24. The method of claim 22 wherein:

forming the lithographic resist pattern comprises forming first and second resist features having a height, H, and separated by a gap having a width, W; and performing the step of etching comprises etching at an angle $\theta$ measured from a vector in a plane defined by the bearing surface, wherein $H/W \geq \tan \theta$.

25. The method of claim 22 wherein:

forming the lithographic resist pattern comprises forming first and second features which have a height, H, and are spaced by a gap having a width, W, wherein the first and second resist features cover a portion of the bearing surface; and performing the step of etching comprises etching at an angle $\theta$ measured from a vector in a plane defined by the bearing surface, wherein $H/W \geq \tan \theta$.

26. A method of contouring a surface of a hydrodynamic bearing slider, the method cormprising:

applying a lithographic resist layer to the slider surface;

providing a single lithographic mask; and forming a vertically tapered feature on the slider surface as a function of the mask pattern by exposing the lithographic resist layer through the single lithographic mask with an exposure level that is graduated along an area of the lithographic resist layer corresponding to the vertically tapered feature, removing the lithographic resist layer as a function of the exposure level to form a patterned resist layer and to uncover portions of the slider surface within the patterned resist layer, and etching the uncovered portions of the slider surface and the patterned resist layer to form the vertically tapered feature with a varying depth.

* * * * *